United States Patent
Moriguchi et al.

(10) Patent No.: US 6,607,971 B1
(45) Date of Patent: Aug. 19, 2003

(54) METHOD FOR EXTENDING A LASER ANNEALING PULSE

(75) Inventors: Masao Moriguchi, Vancouver, WA (US); Apostolos T. Voutsas, Vancouver, WA (US); Yasuhiro Mitani, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/136,676

(22) Filed: Apr. 30, 2002

(51) Int. Cl.$^7$ .......................... H01L 21/20; H01L 21/00
(52) U.S. Cl. ................. 438/487; 438/479; 438/482; 438/486; 438/150
(58) Field of Search .................. 438/166, 487, 438/158, 486

(56) References Cited

U.S. PATENT DOCUMENTS 6,020,224 A * 2/2000 Shimogaichi et al. ....... 438/158
6,322,625 B2 11/2001 Im .............................. 117/43

OTHER PUBLICATIONS

J.S. Im and H.J. Kim, Appl. Phys. Lett., 63, 1969 (1993).
R. Sposili and J.S. Im, Appl. Phys. Lett., 69, 2864 (1996).
J.S. Im, Phys. Stat. Sol. A, 166, 603 (1998).

* cited by examiner

*Primary Examiner*—Carl Whitehead, Jr.
*Assistant Examiner*—David L. Hogans
(74) *Attorney, Agent, or Firm*—David C. Ripma; Matthew D. Rabdau; Scott C. Krieger

(57) ABSTRACT

A method for an efficient extended pulse laser annealing process is provided. The method comprises: supplying a substrate with a thickness; selecting an energy density; selecting an extended pulse duration; laser annealing a substrate region; in response to cooling the substrate region, crystallizing the substrate region; and, efficiently extending the lateral growth of crystals in the substrate region. When the substrate has a thickness of approximately 300 Å, the energy density is selected to be in the range of 400 to 500 millijoules pre square centimeter (mJ/cm$^2$). The pulse duration is selected to be in the range between 70 and 120 nanoseconds (ns). More preferably, the pulse duration is selected to be in the range between 90 and 120 ns. Most preferable, the pulse duration is approximately 100 ns. Then, efficiently extending the lateral growth of crystals in the substrate region includes laterally growing crystals at a rate of approximately 0.029 microns per nanosecond. Processes for 500 Å and 1000 Å substrates are also provided.

10 Claims, 6 Drawing Sheets

METHOD FOR EXTENDING A LASER ANNEALING PULSE

BACKGROUND OF THE INVENTION

1. Field of the Invention

This invention generally relates to thin film transistor (TFT) fabrication and, more particularly, to a method for extending the laser pulse length during the annealing and crystallization of silicon films.

2. Description of the Related Art

Polycrystalline silicon (poly-Si) material is typically used as the active layer of poly-Si TFTs in the fabrication of active-matrix (AM) backplanes. Such backplanes can be used to fabricate AM liquid-crystal displays (LCDs) and can be also combined with other display technologies, such as organic light emitting diodes (OLEDs).

Poly-Si material is typically formed by the crystallization of initially deposited amorphous Si (a-Si) films. This process can be accomplished via solid-phase-crystallization (SPC), by annealing the a-Si films in a furnace at appropriate temperature and for sufficiently long time. Alternatively, laser annealing can also be used to achieve the phase transformation.

These conventional crystallization techniques are applied to a substrate in a manner that yields uniform poly-Si film quality throughout the substrate area. With the SPC method, long annealing times are required, such as 30 hours at 600 C. On the other hand, the laser annealing method has an advantage of greater throughput, as it requires less time for crystallization than the SPC method.

The poly-Si material crystallized using the conventional laser annealing method consists of many grains, with each grain being surrounded by grain boundary. The size of these grains is typically one micron. However, the typical channel length of TFT is approximately 2 to 30 microns. Therefore, it is inevitable that the channel regions of TFT contain several grain boundaries. These grain boundaries act as an electron (hole) trap, degrading TFT performance characteristics and reliability.

Recently, a new laser annealing technique has been developed that allows for significant flexibility in the process techniques, permitting controlled variation in resulting film microstructure. This technique relies on lateral growth of Si grains using very narrow laser beams, that are generated by passing a laser beam through a beam-shaping mask, and projecting the image of the mask to the film that is being annealed. The method is called Laser-Induced Lateral Growth (LILaC).

FIG. 1 is a diagram illustrating the LILaC process (prior art). The initially amorphous silicon film is irradiated by a very narrow laser beamlet, with typical widths of a few microns (i.e. 3–5 $\mu$m). Such small beamlets are formed by passing the original laser beam through a mask that has open spaces or apertures (see FIG. 2), and projecting the beamlets onto the surface of the annealed Si-film.

FIG. 2 is a conventional laser annealing mask (prior art). Returning to FIG. 1, the sequence of images 1 through 4 illustrates the growth of long silicon grains. A step-and-repeat approach is used. The shaped laser "beamlet" (indicated by the 2 parallel, heavy black lines) irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

FIG. 3 is a pictorial representation of a system to accomplish the optical projection and the step-and repeat process (prior art). In order to improve the throughput, longer lateral growth length and larger laser beam dimensions (laser irradiation area per pulse) are required.

Some poly-Si materials formed through the LILaC process have a highly periodical microstructure, where crystal bands of specific width are separated by high-angle grain boundaries. Within the crystal bands, low-angle boundaries are observed with a frequency of occurrence dependent upon certain specifics of the crystallization process, such as film thickness, laser fluence (energy density), pulse duration, and the like. TFTs fabricated on such poly-Si films demonstrate very good characteristics, as long as the direction of conduction is parallel to the direction of the in-crystal low-angle boundaries.

TFTs with greater electron mobility can be fabricated if the substrate crystallization characteristics can be made more isotropic. In other words, the TFT performance depends upon the angle between the main crystalline growth direction, the direction parallel to the laser scanning axis, and the TFT channel. This is due to the formation of sub-boundaries within the crystal domains. The surface roughness at the "hard" grain boundaries, at the edges of the crystal bands/domains, can be significant. This surface roughness prohibits the reduction of the gate insulator thickness, which is one critical step for scaling down the device geometry for future applications. Further, not all these processes can be location controlled. Therefore, by chance only, depending upon the relative size of the crystal domain and the TFT channel length, certain TFTs will not include grain-boundaries in their active area (channel), whereas other TFTs will include one or more boundaries in their active areas. This kind of non-uniformity is highly detrimental for critical-application TFTs where uniformity of characteristics is more essential than absolute performance.

It would be advantageous if the throughput of TFTs fabricated using the LILaC process could be improved.

It would be advantageous if the lateral growth length of crystallized areas could be lengthened using the LILaC process.

It would be advantageous if the laser energy could be used more efficiently in the LILaC process.

SUMMARY OF THE INVENTION

The present invention is based upon on relationship explored between laser pulse length and the maximum lateral growth rates. In order to achieve higher throughput in the LILaC process, longer lateral growth length and/or larger laser beam dimensions are needed. As a general trend, the lateral growth length (LGL) becomes longer as the laser energy density (fluence) increases. The maximum fluence level is limited by agglomeration and maximum laser energy of equipment.

An extension of the pulse duration can bring an associated increase in the LGL, but only if the laser fluence is appropriately increased. For the same laser fluence, a longer pulse duration will not necessarily result in longer LGL. This effect stems from the balance between additional energy input in the film (as a result of longer heating) and additional output from the system as a result of increased heat losses. The balance between these two phenomena ultimately determines whether the film will remain molten for a longer time, thus permitting longer lateral growth to occur.

At high levels of fluence, some damage to the substrate may be caused. Hence, the advantage of achieving longer LGL must be balanced against the possible substrate damage and/or chance of contamination. At the same laser fluence, thinner films demonstrate longer LGL than thicker films, based on the thermal balance between input energy and heat losses through the substrate. With thicker Si-films, a longer pulse duration helps achieve longer LGL, only if the energy density is also significantly increased. However, as stated above, such high fluence may have detrimental effects on the integrity of the substrate. Therefore, the benefit of the longer pulse duration cannot be viewed independently from the fluence requirements. The higher fluence requirement affects two areas: (a) throughput, as a higher fluence demands a smaller beam area (beam dimensions) for a given laser power output, and (b) substrate integrity, as a higher fluence may affect the substrate and, as a minimum, requires a thicker base coat thickness be used. Longer pulse durations are used more advantageously in the crystallization of thin films. However, if the a-Si thickness is too thin, agglomeration very can easily and the poly-Si quality deteriorates. One optimal a-Si thickness is in the range of approximately 20 to 60 nanometers (nm). The "extent" of pulse extension is a matter of balancing the benefit of heat input against inadvertent heat losses. Data indicates that the best results are achieved using a pulse width in the range between 70 and 120 nanoseconds (ns), preferably around 100 ns.

Accordingly, an efficient extended pulse laser annealing method is provided. The method comprises: supplying a substrate with a thickness; selecting an energy density; selecting an extended pulse duration; laser annealing a substrate region; in response to cooling the substrate region, crystallizing the substrate region; and, efficiently extending the lateral growth of crystals in the substrate region.

When the substrate has a thickness of approximately 300 Å, the energy density is selected to be in the range of 400 to 500 millijoules pre square centimeter (mJ/cm$^2$). The pulse duration is selected to be in the range between 70 and 120 nanoseconds (ns). More preferably, the pulse duration is selected to be in the range between 90 and 120 ns. Most preferable, the pulse duration is approximately 100 ns. Then, efficiently extending the lateral growth of crystals in the substrate region includes laterally growing crystals at a rate of approximately 0.029 microns per nanosecond.

Additional details of the above-described method, and details of the method as applied to thicker substrates are provided below.

DETAILED DESCRIPTION OF THE PREFERRED EMBODIMENTS

Figure 1:
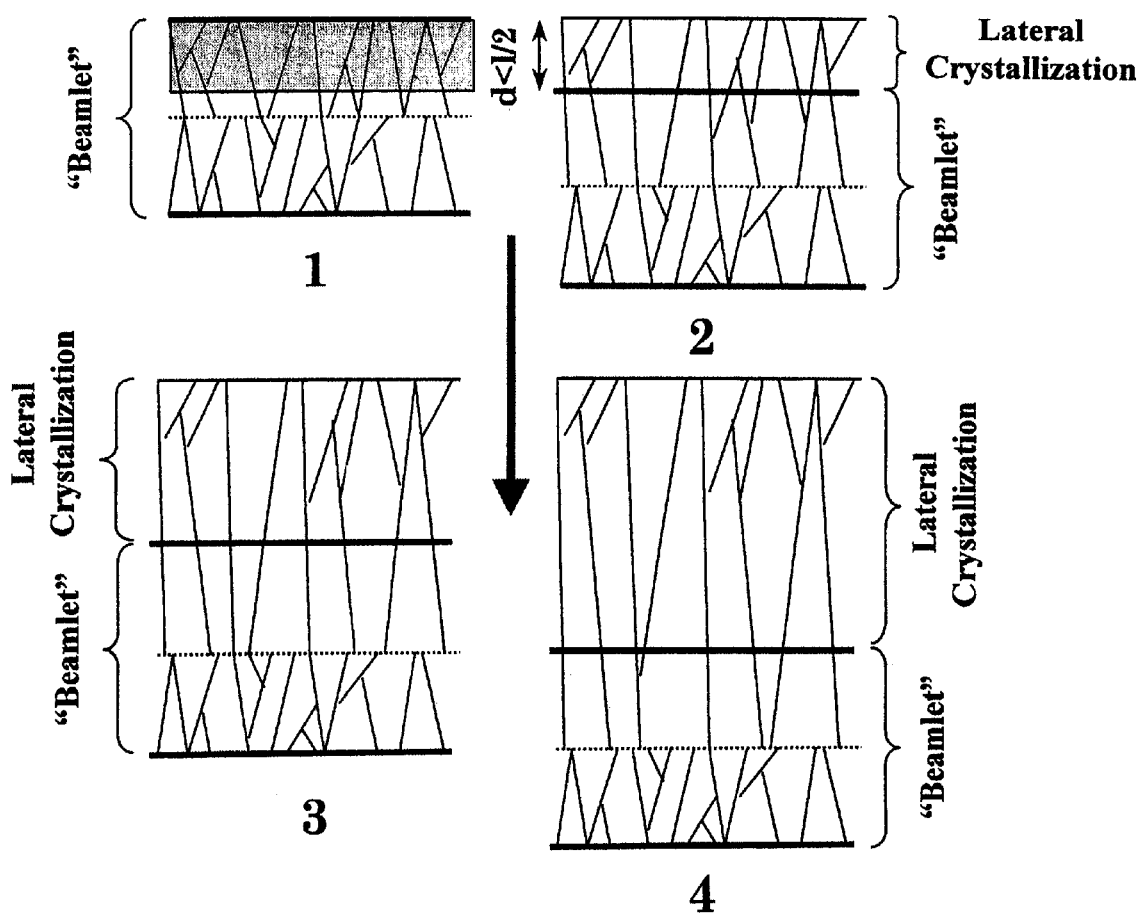
FIG. 1 is a diagram illustrating the LILaC process (prior art).
Figure 2:
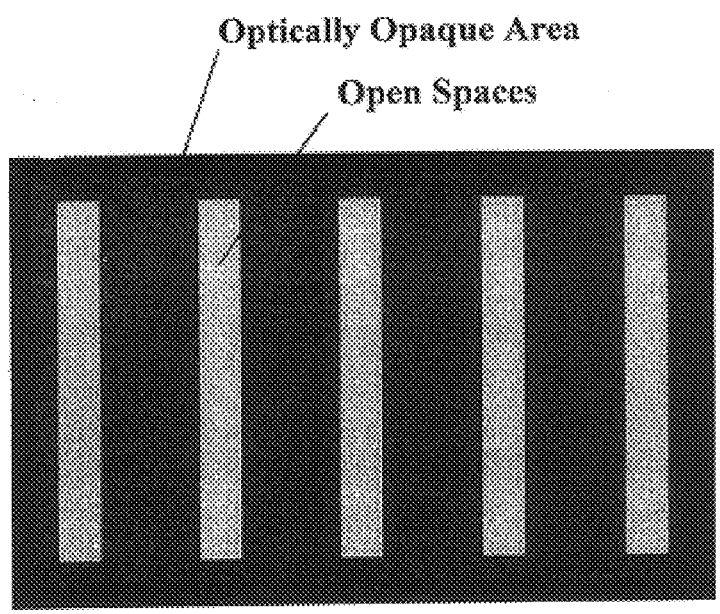
FIG. 2 is a conventional laser annealing mask (prior art).
Figure 3:
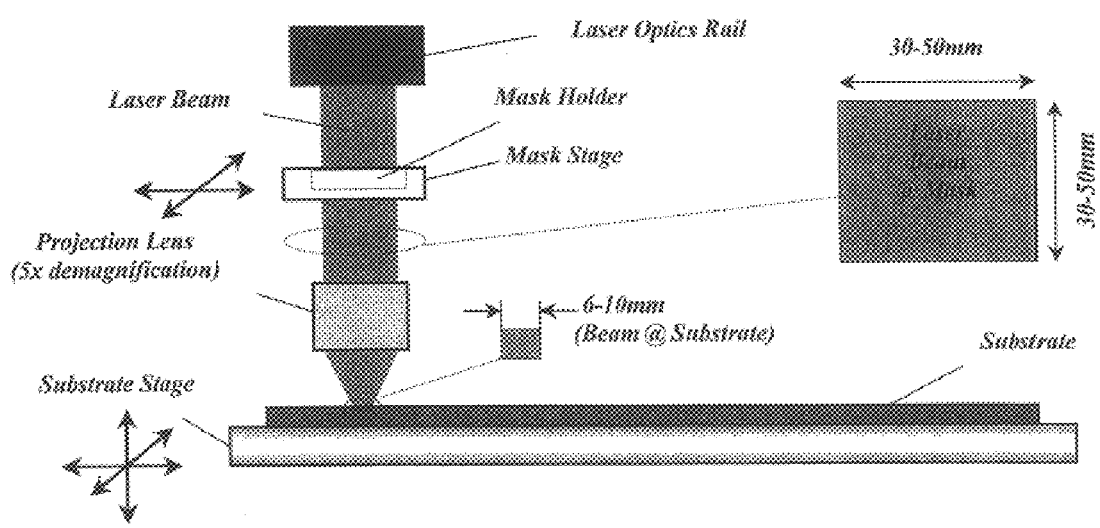
FIG. 3 is a pictorial representation of a system to accomplish the optical projection and the step-and repeat process (prior art).
Figure 4:
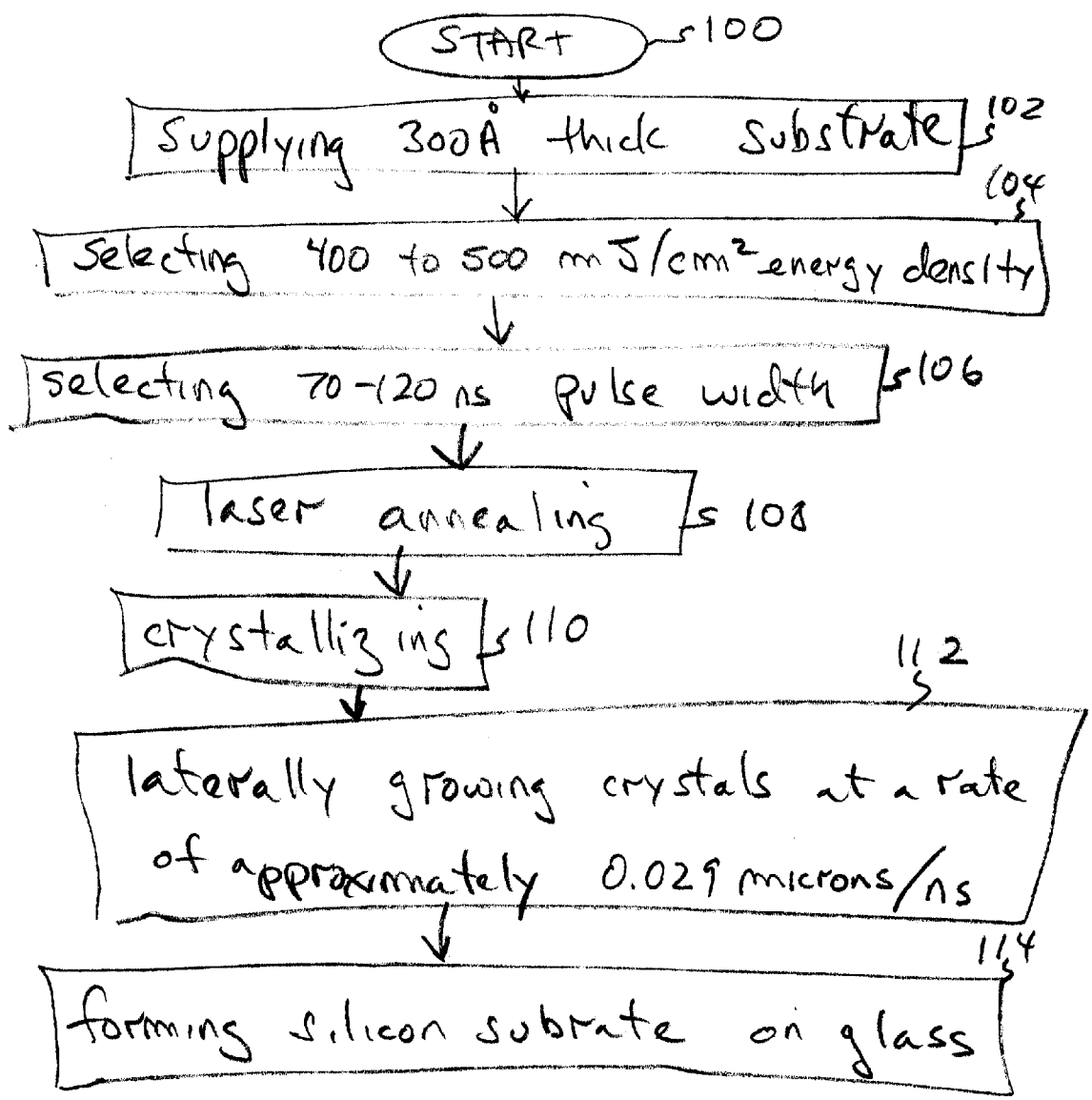
FIG. 4 is a flowchart illustrating the present invention efficient extended pulse laser annealing method.

FIG. 4 is a flowchart illustrating the present invention efficient extended pulse laser annealing method. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 100. Step 102 supplies a substrate with a thickness. Typically, the substrate is silicon substrate. However, silicon compounds such as silicon germanium compounds can also be used. Step 104 selects an energy density. Step 106 selects an extended pulse duration. Step 108 laser anneals a substrate region. Step 110, in response to cooling the substrate region, crystallizes the substrate region. Step 112 efficiently extends the lateral growth of crystals in the substrate region. Typically, a further step is included. Step 114 forms the silicon substrate on a glass substrate having a thickness of approximately 500 Å.

In some aspects, as shown in FIG. 4, supplying a substrate with a thickness in Step 102 includes supplying a substrate with a thickness of approximately 300 Å. Then, selecting a energy density in Step 104 includes selecting a energy density in the range of 400 to 500 millijoules pre square centimeter (mJ/cm$^2$). Selecting an extended pulse duration in Step 106 includes selecting a pulse duration in the range between 70 and 120 ns. More preferably, a pulse duration is selected in the range between 90 and 120 ns. Most preferably, the selected pulse duration is approximately 100 ns.

Then, efficiently extending the lateral growth of crystals in the substrate region in Step 112 includes laterally growing crystals at a rate of approximately 0.029 microns per nanosecond (microns/ns). Alternately, stated, efficiently extending the lateral growth of crystals in the substrate region in Step 112 includes laterally growing crystals at a rate of 0.0035 to 0.007 microns/mJ/cm$^2$.

Figure 5:
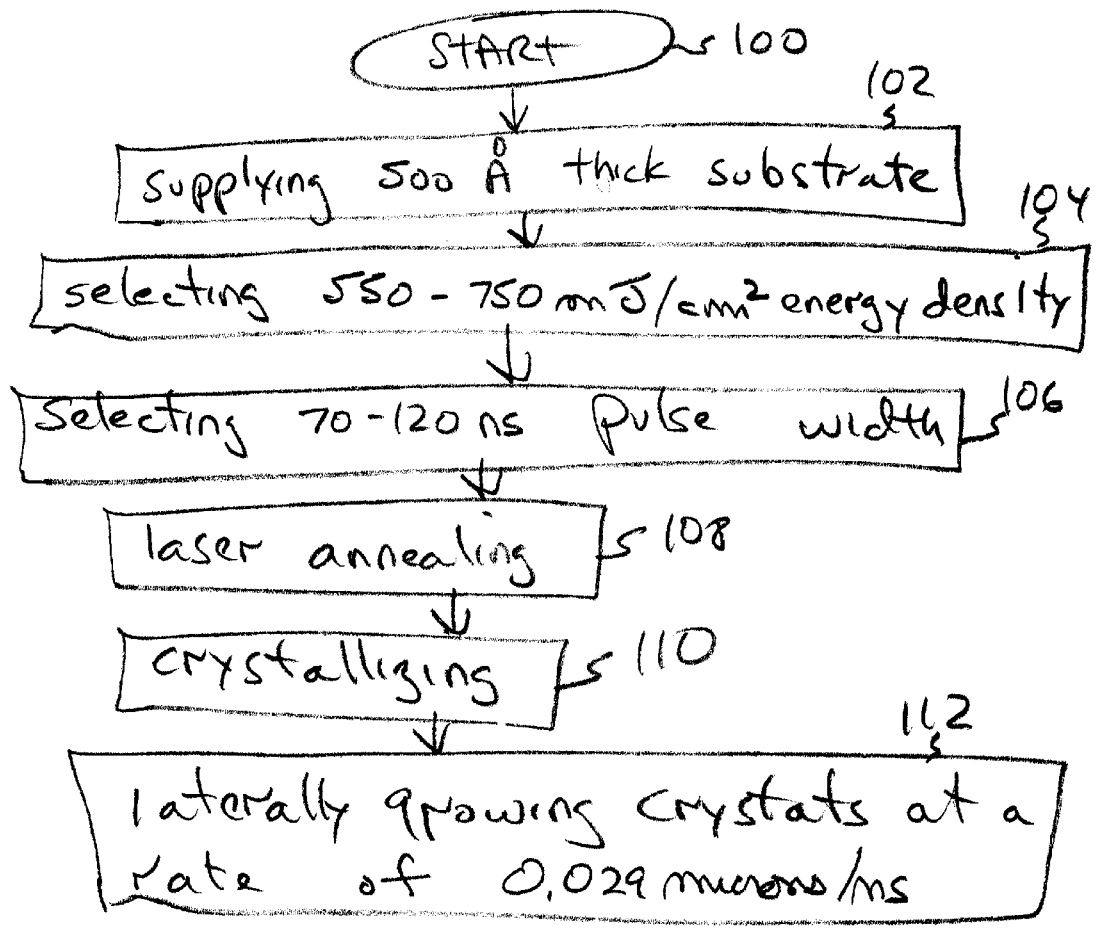
FIG. 5 is a flowchart illustrating the method of FIG. 4 using a silicon substrate thickness of 500 Å.

FIG. 5 is a flowchart illustrating the method of FIG. 4 using a silicon substrate thickness of 500 Å. That is, supplying a substrate with a thickness in Step 102 includes supplying a substrate with a thickness of approximately 500 Å. Then, selecting an energy density in Step 104 includes selecting a energy density in the range of 550 to 750 mJ/cm$^2$. Selecting an extended pulse duration-in Step 106 includes selecting a pulse duration in the range between 70 and 120 ns. As above, a pulse in the range between 90 and 120 ns is preferred, with approximately 100 ns being the most preferable.

Then, efficiently extending the lateral growth of crystals in the substrate region in Step 112 includes laterally growing crystals at a rate of approximately 0.029 microns per nanosecond. Alternately stated, efficiently extending the lateral growth of crystals in the substrate region includes laterally growing crystals at a rate of 0.0035 to 0.007 microns/mJ/cm$^2$.

Figure 6:
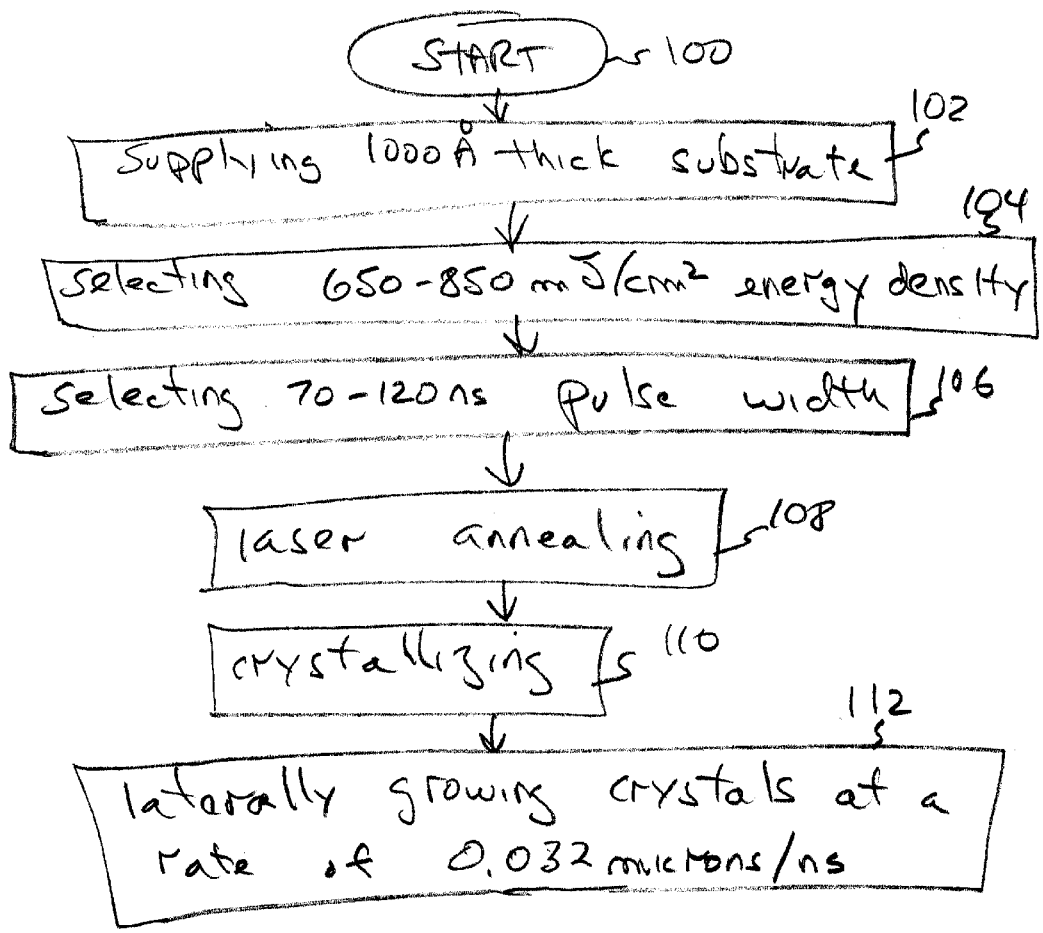
FIG. 6 is a flowchart illustrating the method of FIG. 4 using a silicon substrate thickness of 1000 Å.

FIG. 6 is a flowchart illustrating the method of FIG. 4 using a silicon substrate thickness of 1000 Å. That is, supplying a substrate with a thickness in Step 102 includes supplying a substrate with a thickness of approximately 1000 Å. Then, selecting an energy density in Step 104 includes selecting a energy density in the range of 650 to 800 mJ/cm$^2$. Selecting an extended pulse duration in Step 106 includes selecting a pulse duration in the range between 70 and 120 ns. As above, a pulse in the range between 90 and 120 ns is preferred, with approximately 100 ns being the most preferable.

Then, efficiently extending the lateral growth of crystals in the substrate region in Step 112 includes laterally growing crystals at a rate of approximately 0.032 microns per nanosecond. Alternately stated, efficiently extending the lateral growth of crystals in the substrate region includes laterally growing crystals at a rate of 0.0035 to 0.007 microns/mJ/ cm$^2$.

Table 1 illustrates the relationship between pulse duration, substrate thickness, and lateral growth length (LGL).

TABLE 1

| | Maximum LGL | | |
|---|---|---|---|
| Pulse Duration | 300Å substrate | 500Å substrate | 1000Å substrate |
| 28ns (1x) | 1.66 μm | 1.87 μm | 2.14 μm |
| 90ns (3x) | 2.51 μm | 2.63 μm | 2.87 μm |
| 180ns (6x) | 2.56 μm | 2.45 μm | 2.62 μm |

The pulse duration of the laser beam is changed by using a pulse extender. But the insertion of the pulse extender in the optical path decreases the efficiency of light transmittance from the laser output to the substrate. Therefore, as the pulse extension increases, the maximum fluence achievable on the sample surface decreases. This poses a limitation, especially for the thicker films (500 Å and 1000 Å). In these cases, the fluence is limited by optical efficiency and not by film agglomeration. In other words, an additional increase of LGL may be possible with a laser capable of delivering higher output power. In order to achieve a sufficient laser energy density, the beam dimensions need to be decreased, slowing the process throughput. Optimally therefore, the laser equipment should generate a sufficient long pulse duration, such as 70 to 120 ns, without the necessity of using a pulse extender.

An optimal laser pulse extension process has been described. Examples have been given using three specific substrate thicknesses. However, the present invention process is not limited to just these thicknesses. Other variations and embodiments of the present invention will occur to those skilled in the arts.

We claim:

1. An efficient extended pulse laser annealing method, the method comprising:

supplying a silicon substrate with a thickness of approximately 1000 Å;

selecting an energy density in the range of 650 to 800 millijoules pre square centimeter (mJ/cm$^2$);

selecting a pulse duration in the range between 70 and 120 nanoseconds (ns);

laser annealing a substrate region;

in response to cooling the substrate region, crystallizing the substrate region;

stepping a distance across the substrate region and repeating the laser annealing; and, in response, laterally growing crystal grains in the stepped direction.

2. The method of claim 1 wherein selecting an extended pulse duration includes selecting a pulse duration in the range between 90 and 120 ns.

3. The method of claim 2 wherein selecting an extended pulse duration includes selecting a pulse duration of approximately 100 ns.

4. The method of claim 3 wherein efficiently extending the lateral growth of crystals in the substrate region includes laterally growing crystals at a rate of approximately 0.032 microns per nanosecond.

5. The method of claim 3 wherein efficiently extending the lateral growth of crystals in the substrate region includes laterally growing crystals at a rate of 0.0035 to 0.007 microns/mJ/cm$^2$.

6. An efficient extended pulse laser annealing method, the method comprising:

supplying a silicon substrate with a thickness of approximately 1000 Å;

selecting an energy density in the range of 650 to 800 millijoules pre square centimeter (mJ/cm$^2$);

selecting an extended pulse duration in the range between 70 and 120 nanoseconds (ns);

laser annealing a substrate region;

in response to cooling the substrate region, crystallizing the substrate region; and, efficiently extending the lateral growth of crystals in the substrate region.

7. The method of claim 6 wherein selecting an extended pulse duration includes selecting a pulse duration in the range between 90 and 120 ns.

8. The method of claim 7 wherein selecting an extended pulse duration includes selecting a pulse duration of approximately 100 ns.

9. The method of claim 8 wherein efficiently extending the lateral growth of crystals in the substrate region includes laterally growing crystals at a rate of approximately 0.032 microns per nanosecond.

10. The method of claim 8 wherein efficiently extending the lateral growth of crystals in the substrate region includes laterally growing crystals at a rate of 0.0035 to 0.007 microns/mJ/cm$^2$.

* * * * *